US010551886B1

(12) United States Patent
de la Fuente

(10) Patent No.: US 10,551,886 B1
(45) Date of Patent: Feb. 4, 2020

(54) DISPLAY WITH INTEGRATED GRAPHITE HEAT SPREADER AND PRINTED CIRCUIT BOARD INSULATOR

(71) Applicant: Google LLC, Mountain View, CA (US)

(72) Inventor: Valentin de la Fuente, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/153,971

(22) Filed: Oct. 8, 2018

(51) Int. Cl.
    *G06F 1/20*     (2006.01)
    *H05K 7/20*     (2006.01)
    *B32B 7/12*     (2006.01)
    *H05K 1/02*     (2006.01)

(52) U.S. Cl.
CPC ............... *G06F 1/203* (2013.01); *B32B 7/12* (2013.01); *H05K 1/0203* (2013.01); *H05K 7/20963* (2013.01); *B32B 2264/108* (2013.01); *B32B 2307/302* (2013.01); *B32B 2457/208* (2013.01)

(58) Field of Classification Search
CPC ....................................................... G06F 1/203
See application file for complete search history.

(56) References Cited

U.S. PATENT DOCUMENTS

| | | | | |
|---|---|---|---|---|
| 6,075,696 | A * | 6/2000 | Progl ...................... | G06F 1/203 16/226 |
| 7,303,820 | B2 | 12/2007 | Capp et al. | |
| 7,969,739 | B2 * | 6/2011 | Tsunoda ................... | G06F 1/203 165/185 |
| 8,675,363 | B2 * | 3/2014 | Crooijmans ............ | G06F 1/203 361/679.26 |
| 9,430,006 | B1 | 8/2016 | Hayashida | |
| 9,836,099 | B2 * | 12/2017 | Huang ..................... | G06F 1/203 |
| 9,980,412 | B2 * | 5/2018 | Qiu ..................... | H05K 7/20509 |
| 10,403,189 | B2 * | 9/2019 | Aurongzeb ........... | G06F 1/1637 |
| 2005/0111195 | A1 * | 5/2005 | Wu ........................ | H01L 23/433 361/705 |
| 2006/0215368 | A1 * | 9/2006 | Tsai ...................... | H01L 23/427 361/704 |
| 2007/0146990 | A1 * | 6/2007 | Hsieh ........................ | G06F 1/20 361/690 |
| 2015/0301568 | A1 | 10/2015 | Hill et al. | |
| 2018/0235073 | A1 | 8/2018 | Ma et al. | |
| 2019/0041922 | A1 * | 2/2019 | Kurma Raju ........... | G06F 1/203 |

OTHER PUBLICATIONS

International Search Report and Written Opinion for Application No. PCT/US2019/050164, dated Dec. 2, 2019, 21 pages.

* cited by examiner

*Primary Examiner* — Robert J Hoffberg
(74) *Attorney, Agent, or Firm* — Brake Hughes Bellermann LLP

(57) ABSTRACT

An apparatus is described that includes an enclosure including a first sidewall, a second sidewall aligned parallel to the first sidewall, a front wall, a rear wall aligned parallel to the front wall, and at least one structure disposed between the front wall and the rear wall. The apparatus also includes a heat generating element within the enclosure, the heat generating element being mounted to a first surface of the at least one structure and a flexible sheet assembly configured to dissipate heat generated by the heat generating element away from the at least one heat generating element and across a lateral surface of the rear wall of the enclosure.

20 Claims, 9 Drawing Sheets

DISPLAY WITH INTEGRATED GRAPHITE HEAT SPREADER AND PRINTED CIRCUIT BOARD INSULATOR

TECHNICAL FIELD

Embodiments relate to heat dissipation in computing devices.

BACKGROUND

Electronic devices generate heat when operating, and the heat needs to be dissipated. Managing the heat dissipation efficiently can improve device performance by ensuring that internal components, such as a CPU, are cooled to reduce performance throttling that can be caused by high internal temperatures of the device.

In addition, heat generated by a computing device increases the temperature of external surfaces of the device, which can be uncomfortable or even dangerous to a user of the device.

Thus, there is a need for mechanisms to disperse heat generated by heat-generating device components.

SUMMARY

In a first general aspect, an apparatus is described that includes an enclosure including a first sidewall, a second sidewall aligned parallel to the first sidewall, a front wall, a rear wall aligned parallel to the front wall, and at least one structure disposed between the front wall and the rear wall. The apparatus also includes a heat generating element within the enclosure, the heat generating element being mounted to a first surface of the at least one structure and a flexible sheet assembly configured to dissipate heat generated by the heat generating element away from the at least one heat generating element and across a lateral surface of the rear wall of the enclosure. The flexible sheet assembly includes a first portion coupled to at least a portion of the front wall of the enclosure, a second portion in thermal contact with the heat generating element on at least two surfaces of the heat generating element, and a third portion coupled to a second surface of the at least one structure, the third portion being in thermal contact with a length of the rear wall of the enclosure.

Implementations may include one or more of the following features. The apparatus where the at least one structure includes a printed circuit board, the heat generating element includes a CPU, and the flexible sheet assembly is in thermal contact with both the printed circuit board and the CPU. The apparatus where the flexible sheet assembly includes multiple layers including at least an electrically insulating layer, a heat dissipating layer, and an adhesive layer. The apparatus where the at least one structure is a printed circuit board housing at least a display panel, a CPU, and a battery, and the flexible sheet assembly includes a graphite layer and an electrically insulating layer configured to provide heat spreading and electrical insulation for the display panel, the CPU, and the battery.

The apparatus where the display panel is a touch screen display for a portable computing device, and the electrically insulating layer is integrated into the graphite layer of the flexible sheet assembly. The apparatus where the front wall is a display cover glass of the apparatus, and the rear wall, the first sidewall, and the second sidewall provide a conductive enclosure assembly coupled to the display cover glass, the conductive enclosure assembly configured to dissipate heat from the flexible sheet assembly across a lateral surface of the rear wall. The apparatus where the display cover glass, the heat generating element, the at least one structure, and the flexible sheet assembly are combined with a display panel to form a display panel assembly for a portable computing device.

The apparatus where the flexible sheet assembly is attached to a first surface of the front wall with adhesive, the flexible sheet assembly is attached to the second surface of the at least one structure with adhesive, and where the flexible sheet assembly is bent around the heat generating element and the at least one structure to provide thermal contact with at least two surfaces of each of the at least one structure and the heat generating element. The apparatus where the adhesive includes a thermal conductor. The apparatus where the flexible sheet assembly is in physical contact with the at least one structure and the front wall. The apparatus where the at least one structure includes a printed circuit board and the heat generating element includes a CPU communicably coupled to multiple display panels mounted to the printed circuit board.

In a second general aspect, a display assembly is described that includes a cover glass, a printed circuit board, a touch display panel mounted to a first lateral surface of the printed circuit board, and a continuous heat spreader element configured to dissipate heat generated by a heat generating element. The continuous heat spreader element may include a first portion coupled to at least a portion of the cover glass, a second portion in thermal contact with the heat generating element on at least two surfaces of the heat generating element, and a third portion coupled to a second lateral surface of the printed circuit board. The third portion may be configured to be placed in thermal contact with a length of a conductive wall of a computing device enclosure. In some implementations, the continuous heat spreader element is bent around the heat generating element and the printed circuit board to provide thermal contact with the heat generating element and electrical insulation for the printed circuit board.

Implementations may include one or more of the following features. The display assembly where the heat generating element is a battery and the continuous heat spreader element is formed of at least one layer of insulating material and at least one layer of graphite configured to conduct heat generated by the battery away from the touch display panel and away from the battery. The continuous heat spreader element may be coupled to a cover glass and in thermal contact with the battery. In some implementations, the continuous heat spreader element is formed of graphite that provides heat dissipation away from the touch display panel and to the conductive wall of the computing device enclosure. In some implementations, the continuous heat spreader element is a layered graphite heat spreading sheet folded over the touch display panel and adhered to the printed circuit board on a first side of the continuous heat spreader element.

In some implementations, the display assembly is for a portable computing device and the continuous heat spreader element includes at least one electrical insulation layer formed of polyethylene terephthalate (PET), at least one graphite heat dissipating layer, and at least one adhesive layer.

In a third general aspect, a computing device is described that includes at least one processor configured to access memory, at least one communications interface, an enclosure including a conductive rear surface aligned parallel to a cover glass surface in which the rear surface is coupled to the cover glass surface, a touch display panel mounted on a first surface of a printed circuit board and disposed between the rear surface and the cover glass surface of the enclosure, and a flexible sheet assembly. The flexible sheet assembly may be configured to conduct heat generated by the heat generating element away from the at least one heat generating element and across a lateral surface of the rear surface.

In some implementations, the flexible sheet assembly includes a first portion coupled to at least a portion of the cover glass surface, a second portion in thermal contact with the heat generating element, and a third portion coupled to a second surface of the at least one structure, the third portion being in thermal contact with a length of the conductive rear surface.

Implementations may include one or more of the following features. The computing device may include a flexible sheet assembly that is in physical contact with at least a portion of the touch panel display, the printed circuit board, and the cover glass surface. In some implementations, the flexible sheet assembly includes a woven sheet of graphite strands. In some implementations, the flexible sheet assembly includes a sheet of copper.

The details of one or more implementations are set forth in the accompanying drawings and the description below. Other features will be apparent from the description and drawings, and from the claims.

BRIEF DESCRIPTION OF THE DRAWINGS

Like reference symbols in the various drawings indicate like elements.

DETAILED DESCRIPTION

Figure 1:
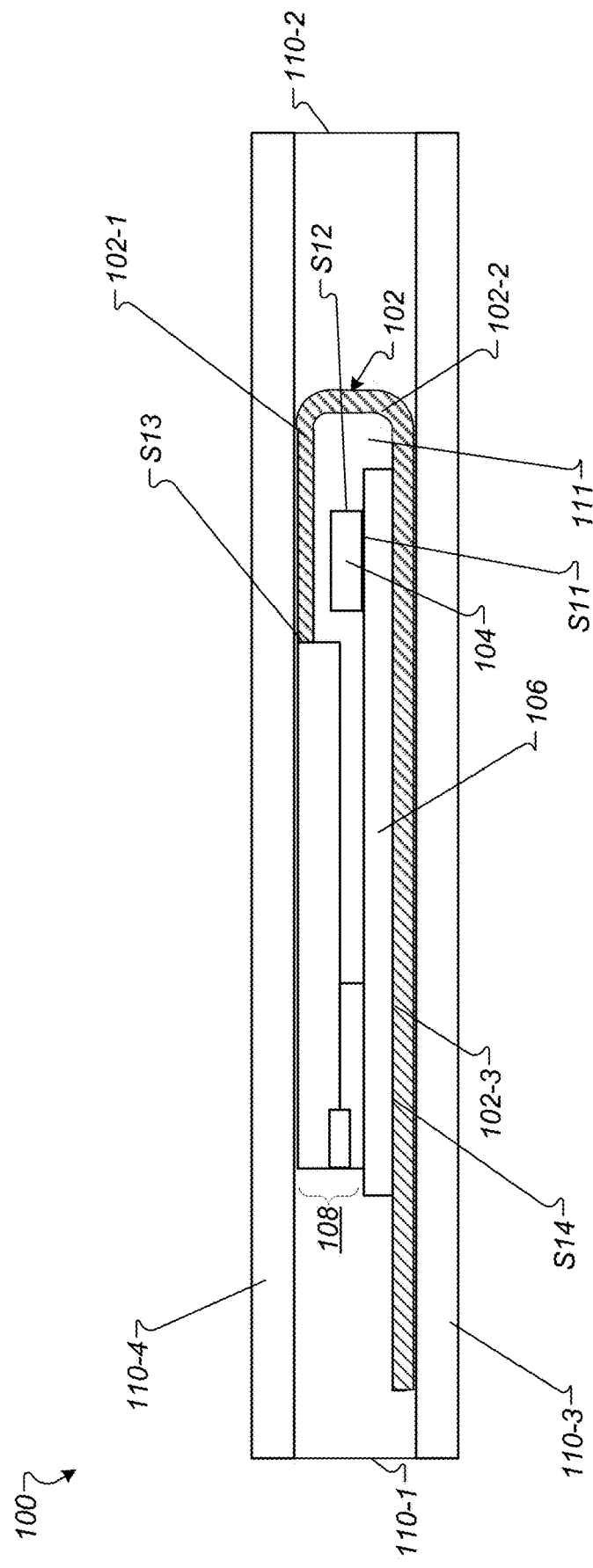
FIG. 1 illustrates a block diagram of a computing device including a heat spreader.

In accordance with implementations described herein, a flexible, thermally conductive material may be used to dissipate heat away from components in an electronic device (e.g., a computing device). The material may be formed into a heat spreading sheet (i.e., a heat spreader) to conduct heat away from areas of heat (e.g., hot spots) generated by the components (e.g., a processor, a display, a battery, etc.) in the computing device.

Example heat spreaders may include one or more layers of thermally conductive material with one or more integrated layers of insulation and/or adhesive that may be used to apply the heat spreader to device components. Applying such a heat spreader to device components may include placing the heat spreader in thermal contact and/or physical contact with at least one surface of one or more device components. As the components generate heat, the heat spreader may transport the heat out and away from one or more components to a heat sink and/or to an enclosure surface of the device. In some implementations, the heat spreader may evenly distribute the heat across a large surface area (e.g., of a device enclosure) to eliminate hot spots caused by heated components in a particular device.

In general, the heat spreaders described herein may include different sizes of flexible sheets of thermally conductive materials. Examples of thermally conductive materials that the heat spreaders described herein can include graphite, aluminum, copper, titanium, or other thermally conductive metal. For example, the heat spreaders described herein may be formed of woven strands of thermally conductive metal (e.g., aluminum, copper, titanium, etc.). For example, the heat spreaders may be formed of a thermally conductive sheet of woven metal plated fiber strands. In some implementations, the heat spreaders described herein may be formed of a sheet of bendable metal. In general, the heat spreaders described throughout this disclosure may be formed and/or bent into multiple shapes (e.g., bent at an angle) without breaking the heat spreader. In some implementations, such heat spreaders may be bent to form arcs and/or corners shaped around device components.

The heat spreaders described herein may provide advantages over conventional heat dissipating sheets. For example, conventional heat dissipating sheets do not include an integrated insulation layer for insulating device components. Rather, conventional heat dissipating sheets are applied over an insulating layer (e.g., a layer of Mylar® film). This separate insulating layer may reduce heat transfer because the insulator does not conduct heat and thus cannot assist in dissipating heat from the device component in contact with the insulator. The heat spreaders described in this disclosure are composed of the thermally conductive material (e.g., graphite, aluminum, copper, titanium, etc.) that spreads heat and also an integrated electrically insulating material (e.g., polyethylene terephthalate (PET), polyethylene naphthalate (PEN), polyimide (PEI), etc.) to provide electrical insulation of components in the computing device. For example, a single heat spreading and electrically insulating sheet assembly may be wrapped around a display assembly surface and around an underside of a printed circuit board (PCB) to provide both insulation and heat dissipation for the PCB, components on the PCB, and the display assembly. The heat spreaders described herein may eliminate the need for a separate Mylar® insulator that conventional display assemblies include between the display unit and a PCB housing the display unit. In some implementations, such a sheet assembly may include multiple layers adhered together. For example, the multiple layers may include at least an electrically insulating layer, a heat dissipating layer, and an adhesive layer.

In some implementations, the heat spreaders described herein may assist in lowering the temperature of hot components while decreasing the overall power consumption used by a computing device. In addition, the heat spreaders may shield components from hot spots and thus increase a usage efficiency for particular devices and/or components utilizing such heat spreaders. In some implementations, the heat spreaders may distribute heat throughout the layer of the heat spreader to achieve a more uniform surface temperature of a computing device to control a user-touch temperature, which can improve the user experience with the device. In some implementations, the heat spreaders may shield display components (e.g., LED, OLED) devices and associated components to reduce the likelihood of overheating, thus improving the performance and longevity of the display device housing the display components.

In general, the heat spreaders described herein may function as both a heat spreading material and an insulator of components in thermal contact with the heat spreader. The computing devices that integrate the heat spreaders described herein can be advantageously made with a reduced thickness than can computing devices manufactured using conventional techniques and conventional separate insulating layer(s) (e.g., Mylar® film layers).

FIG. 1 illustrates a block diagram of a computing device 100 including a heat spreader 102. The heat spreader 102 may be formed of a continuous sheet of thermally conductive material, insulator material, and/or adhesive material. The continuous sheet may extend out and around a number of structures and/or components within computing device 100. The heat spreader 102 includes a first portion 102-1, a second portion 102-2, and a third portion 102-3 shown wrapped around a number of components. The heat spreader 102 may be a flexible, thermally conductive material (e.g., graphite, copper, aluminum, titanium, etc.). For example, the heat spreader 102 (portions 102-1, 102-2, and 102-3) may be formed and/or bent into multiple shapes (e.g., bent at an angle) without breaking.

As shown, the computing device 100 includes a heat generating element 104, a first structure 106, and a second structure 108, each wrapped, at least in part, by the heat spreader 102 (e.g., first portion 102-1, the second portion 102-2, and the third portion 102-3). The heat spreader 102, the heat generating element 104, the first structure 106, and the second structure 108 may be dimensionally longer and/or shorter than shown, with regard to each other. For example, the heat spreader 102 is shown as extending out and around the heat generating element 104, the first structure 106, and the second structure 108. In other examples, the heat spreader 102 may partially extend across one or more of the surfaces shown in FIG. 1. In general, any number of components may be encased by, partially encased by, and/or coupled to heat spreader 102 such that heat spreader 102 provides heat spreading and/or electrical insulation for such components.

The computing device 100 also includes an enclosure to encapsulate device components. The enclosure may include at least a first sidewall 110-1 and a second sidewall 110-2 aligned parallel to the first sidewall. The first sidewall 110-1 and the second sidewall 110-2 may be coupled to a rear wall 110-3 on a top edge for each respective sidewall 110-1 and 110-2. The first sidewall 110-1 and the second sidewall 110-2 may be coupled to a front wall 110-4 on a bottom edge for each respective sidewall. The rear wall 110-3 may be aligned in parallel to the front wall 110-4.

The first portion 102-1 and the third portion 102-3 of the heat spreader are shown substantially parallel to the rear wall 110-3 and the front wall 110-4. The second portion 102-2 of the heat spreader is shown substantially perpendicular to the rear wall 110-3 and the front wall 110-4. The second portion 102-2 is bent around components to connect the first portion 102-1 and the third portion 102-3. Other shapes and bends are possible. In the depicted example of FIG. 1, an air gap 111 is generated when bending the heat spreader 102. The air gap 111 can also provide heat dissipation and spread as well as insulating properties for components 104, 106, etc.

In some implementations, the first portion 102-1 may be coupled to at least a portion of the front wall 110-1 of the enclosure 110. In some implementations, the second portion 102-2 may be in thermal contact with the heat generating element 104 on at least two surfaces of the heat generating element 104. For example, at a surface (S11) and a surface (S12). In some implementations, the third portion 102-3 may be coupled to a second surface (S14) of the at least one structure 106. The third portion 102-3 may be in thermal contact with a length of the rear wall 110-3 of the enclosure 110. The length in contact may be an entire length (or substantially the entire length) of the rear wall 110-3.

In some implementations, the front wall 110-4 is a display cover glass to cover a display module of the computing device 100. In such an example, the rear wall 110-3, the first sidewall, 110-1 and the second sidewall 110-2 may provide a conductive enclosure assembly coupled to the display cover glass (e.g., front wall 110-4). The conductive enclosure assembly (e.g., 110-1, 110-2, and 110-3) may be configured to dissipate heat from the flexible sheet assembly (e.g., heat spreader 102) across a lateral surface of the rear wall 110-3, for example. For example, the rear wall 110-3 may be configured to receive and dissipate the heat conducted from elements within device 100 using the heat spreader 102. At least one structure may be disposed between the front wall 110-4 and the rear wall 110-3. For example, the heat generating element 104 is shown within the enclosure 110 and mounted to a first surface (e.g., S11) of the first structure 106. The heat generating element 104 is also shown in thermal contact with the heat spreader 102 (e.g., 102-1 and 102-2). In addition, the heat spreader 102 is shown in contact with an edge (e.g., S13) of second structure 108 and in thermal contact with a second surface (S14) of the at least one structure 106. In general, the heat spreader 102 may be in thermal and/or physical contact with any number of components within enclosure 110.

In the implementations described herein, a number of example enclosures are described for housing electronic devices. In general, each enclosure may house one or more sub-devices, one or more modules, and/or any number of mechanical and electrical components to provide a functional portable computing device, for example, that integrates one or more heat spreaders 102 into a device housing of the portable computing device of enclosure 110.

In some implementations, the heat spreader 102 may include a layer of flexible, thermally conductive sheet of woven graphite strands. In some implementations, the heat spreader 102 may include a layer of a flexible, thermally conductive sheet of bonded graphite fiber. In some implementations, the heat spreader 102 may include a layer of a flexible, thermally conductive sheet of bonded graphite flakes. In some implementations, the heat spreader 102 may include a layer of a flexible, sheet of thermally conductive metal (e.g., aluminum, copper, or titanium).

In some implementations, the heat spreader 102 may be formed of at least one pyrolytic graphite sheet having a thermal conductivity of more than 1000 Watts per meter Kelvin (W/mK), e.g., between 1000 W/mK and 1500 W/mK. Such a graphite sheet may be about 0.01 millimeters to about 0.017 millimeters in thickness. In general, the heat spreaders described herein are suited to spread thermal heat and shield components from heat sources in minimal dimensional space. The heat spreader 102, for example, may be composed of a light weight sheet of graphite that provides a high in-plane thermal conductivity.

In some implementations, the heat spreader 102 may be made of a number of layers to be both electrically insulating and thermally conductive. For example, the heat spreader 102 may include an electrical insulating layer made of electrically insulating material including, but not limited to, polyethylene terephthalate (PET), polyethylene naphthalate (PEN), or polyimide (PEI), etc. In some implementations, the electrical insulating layer may be included as part of the heat spreader 102 to prevent shorting of components within the enclosure 110. For example, the electrically insulating layer may be laminated to the flexible sheet assembly (e.g., heat spreader 102). The sheet may also include an integrated adhesive layer (continuous or intermittently placed on the flexible sheet.

A length and/or width of the heat spreader 102 may be based on the dimensions of other components of the computing device (e.g., the heat generating element 104), a desired amount of heat transfer by the heat spreader 102, a desired position on the heat generating element to transfer heat by the heat spreader, and the like. In some implementations, the heat spreader 102 may extend longer than the heat generating element 104, the first structure 106, the second structure 108, and/or other device components so as to provide additional surface area of the heat spreader 102 with which to dissipate heat from the heat generating element 104 and/or the first structure 106 to another device surface, for example. In some implementations, the heat spreader 102 may be shorter in one or more portions, if for example, hot spots are generated on only such portions of the heat generating element 104.

In some implementations, the heat generating element 104 may be, for example, a display, a hard drive, a CPU, a battery, a graphics chip, an inverter/converter, memory chips, and the like. The heat generating element(s) 104 may generate a hot spot (e.g., a temperature hot spot) on the structure 106. The heat spreader 102 may be configured to conduct heat generated by the heat generating element(s) 104 away from the structure 106 and to the rear wall 110-3, for example. In other words, the heat spreader 102, which may be made of a material having a relatively high thermal conductivity (compared with that of the elements 104, 106, and 110-4), may be configured as an efficient heat transfer mechanism for reducing the heat at a hot spot generated by the heat generating element(s) 104.

In some implementations, the first structure 106 may be a printed circuit board (PCB), a frame, a heat sink, a heat pipe, a base plate, and the like of the computing device 100. For example, the first structure 106 may be a PCB with a mounted display panel, a CPU, and a battery. (e.g., heat generating element 104). The heat spreader 102 (e.g., a flexible sheet assembly) may be placed in thermal contact with the PCB, the CPU, and the battery (e.g., heat generating elements 104) to provide heat dissipation for each component. In some implementations, the PCB is a dedicated PCB for the display panel. In some implementations, the display panel is a touch screen display for a portable computing device. The heat spreader 102 may wrap (e.g., or extend across) at least one surface of the PCB (e.g., structure 106) and may partially surround or couple to display panels 212.

In some implementations, the heat spreader 102 may include an electrical insulator layer integrated with a graphite layer. The graphite layer may dissipate heat away from any heat generating components (e.g., the CPU, the battery, the PCB, etc.) while the electrical insulator layer insulates one or more of the heat generating components from heat and/or from shorting to the graphite layer, for example.

In some implementations, the second structure 108 may be one or more display panels for emitting image content through front wall 110-4 (e.g., a display cover glass). In some implementations, at least one edge of the display panel (e.g., structure 108) may abut the heat spreader 102. In some implementations, the structure 108 is coupled between the front wall 110-4 and the portion 102-1 of the heat spreader 102.

At least one layer of the heat spreader 102 may be formed of graphite (or other thermally conductive material) to provide heat dissipation for the heat generating elements (e.g., element 104). For example, the graphite (or other thermally conductive material) of the heat spreader 102 may provide heat spreading to disperse heat from the element 104 and across rear wall 110-3 to ensure that printed circuit board structure 106 does not develop hot spots that may be perceived by a user using a device housing the display structure 108. The insulating layer within the heat spreader 102 may insulate and/or shield components from other components, materials, heat and/or device structures within the enclosure 110.

Figure 2:
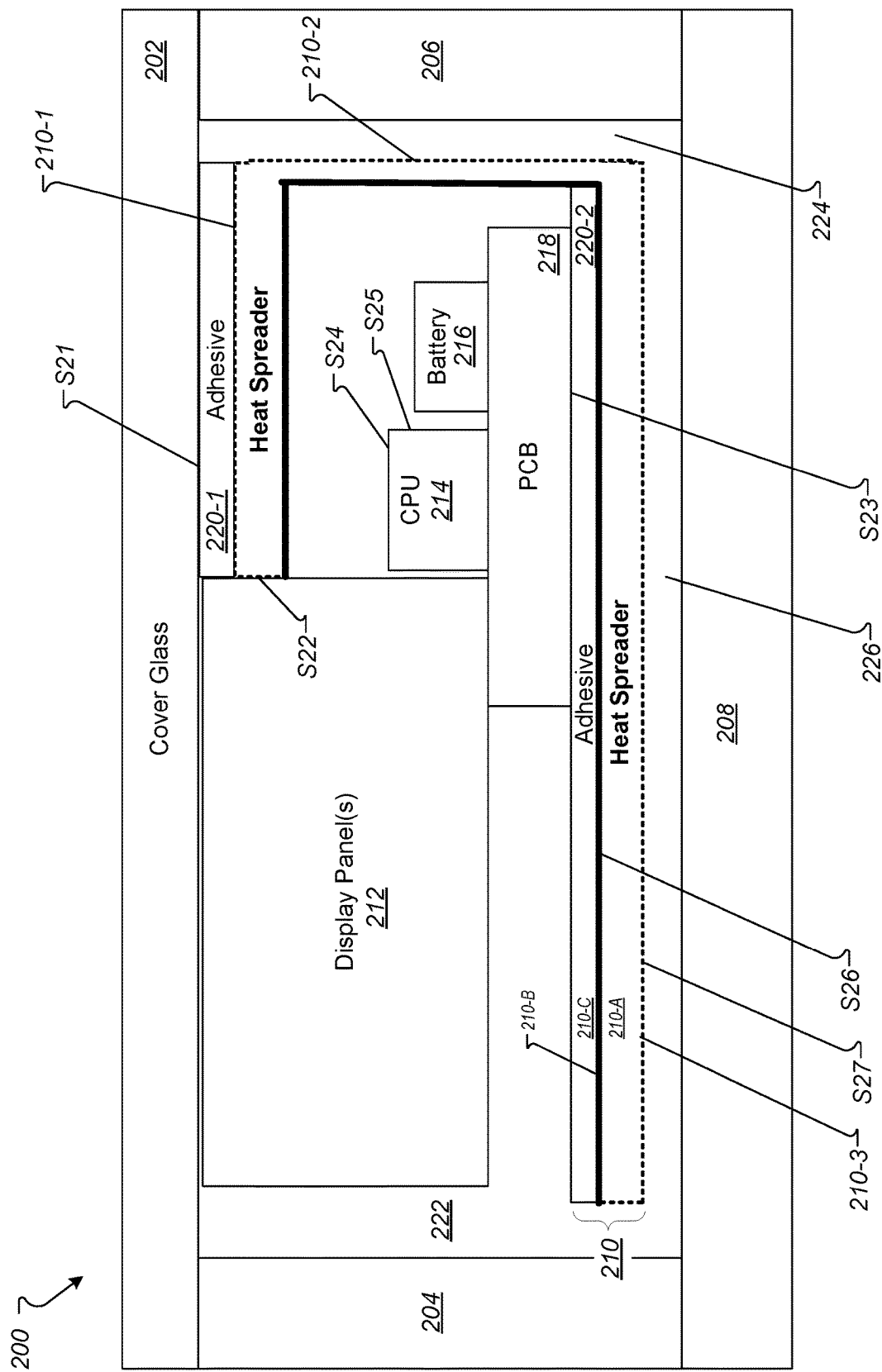
FIG. 2 is a block diagram illustrating a cross-sectional view of various components of an example computing device.

FIG. 2 is a block diagram illustrating a cross-sectional view of various components of a computing device 200. The computing device 200 may be a tablet computing device having an enclosure. The enclosure may include a number of enclosure portions including a cover glass 202, a first sidewall 204, a second sidewall 206, and a rear wall 208. In some implementations, the enclosure does not include the cover glass 202. In such examples, the cover glass 202 may be part of a display assembly that assembles to the first sidewall 204 and the second sidewall 206 to form an encasement for the computing device described herein when the sidewalls 204, 206 are coupled to rear wall 208, for example. The elements described with respect to FIG. 2 may be included in any of the figures described herein.

As shown in FIG. 2, the computing device 200 includes within the enclosure, a heat spreader 210, at least one display panel 212, at least one CPU 214, at least one battery 216, at least one PCB 218, and adhesive 220-1 and adhesive 220-2. The heat spreader 210 includes at least three portions 210-1, 210-2, and 210-3 that may surround (or partially surround) any number of components of device 200.

The heat spreader 210 may be formed of multiple layers. For example, the heat spreader may include a conductive layer 210-A, an insulator layer 210-B, and an adhesive layer 210-C, each described in detail throughout this disclosure.

The heat spreader portion 210-1 is attached to a first surface (S21) of the cover glass 202. For example, the heat spreader portion 210-1 may be coupled to a first surface (S21) of the cover glass 202 using adhesive 220-1 (e.g., a thermally conductive glue/epoxy or thermally conductive tape) and/or a paste/grease (e.g., a thermally conductive paste/grease) shown as layer 210-A. A second surface (S22) of the heat spreader portion 210-1 may be in thermal contact with a portion of display panel 212.

In some implementations, the heat spreader portion 210-1 forms a continuous edge with heat spreader portion 210-2 and 210-3. Thus, a surface (S23) of PCB 218 may be in thermal (and/or physical) contact with heat spreader portion 210-2, which may provide thermal transport of heat away from PCB 218 and toward heat spreader portion 210-3 (and/or portion 210-2). The enclosure, including sidewalls 204 and 206, may assist the heat spreader 210 to dissipate heat from internal components. Similarly, heat dissipation can occur from CPU 214 and battery 216 (e.g., at surface S25) toward any portion of the enclosure of computing device 200, for example.

The heat spreader 210 may be bent around one or more of the heat generating elements (e.g., CPU 214, battery 216) on at least two surfaces of CPU 214, for example (e.g., surfaces S24 and S25). In such an example, the heat spreader 210 may be in thermal contact with both the CPU 214 and the PCB 218 that houses the CPU 214.

The PCB 218 may be coupled to heat spreader portion 210-3 via adhesive 220-2 at surface (S26). In some implementations, the adhesive 220-2 may include a thermal conductor and may also connect layer 210-C to insulating layer 210-B. In some implementations, the adhesive 220-2 is extended along PCB 218 on the second surface (S23), but does not extend across heat spreader 210. For example, the adhesive 220-2 may be copper tape. In some implementations, the heat spreader 210 is in physical contact with the heat generating elements 214, 216, the at least one structure (e.g., PCB 218), and the front wall of the computing device (e.g., cover glass 202). In general, the heat spreader at least partially surrounds at least PCB 218, CPU 214 and battery 216 on at least two walls of each component.

The display panel 212 may be configured to produce output seen by a user through the cover glass 202. Air gaps 222, 224, and 226 may surround any number of components and portions of the heat spreader 210 to assist with heat transfer and heat dissipation. In some implementations, the air gap 226 is between 0.2 millimeters and 0.8 millimeters. In some implementations, the air gap 226 is about 0.3 millimeters. In some implementations, the air gap 226 is between 0.6 millimeters and 1.0 millimeters. In some implementations, the air gap 226 is about 0.75 millimeters.

In some implementations, the heat spreader 210 is composed of a single layer of graphite that may be between 0.01 millimeters and 0.1 millimeters thick. In some implementations, the heat spreader 210 is composed of a graphite layer with a laminated on polyethylene terephthalate (PET) layer that results in a flexible sheet assembly that is about 0.25 millimeters thick. Such a sheet may be part of a display assembly for a portable computing device. The flexible sheet assembly may be a continuous heat spreader that is coupled to one or more other components using an adhesive layer.

As shown in FIG. 2, the heat spreader portions 210-1, 210-2, 210-3 may be at least partially in thermal contact with the heat generating element (e.g., CPU 214) such that the heat spreader 210 is in contact with or coupled to (or substantially in contact with or coupled to) more than one side surface (e.g., S24 and S25) of the CPU 214. The heat spreader 210 may be in thermal contact with the display panel 212, the CPU 214, the battery 216, the PCB 218, and/or other structures using an adhesive (e.g., a thermally conductive glue/epoxy or thermally conductive tape) and/or a paste/grease (e.g., a thermally conductive paste/grease). In some implementations, the heat generating element (e.g., CPU 214) is communicably coupled to multiple display panels 212, which are mounted to the PCB 218, for example.

Figure 7:
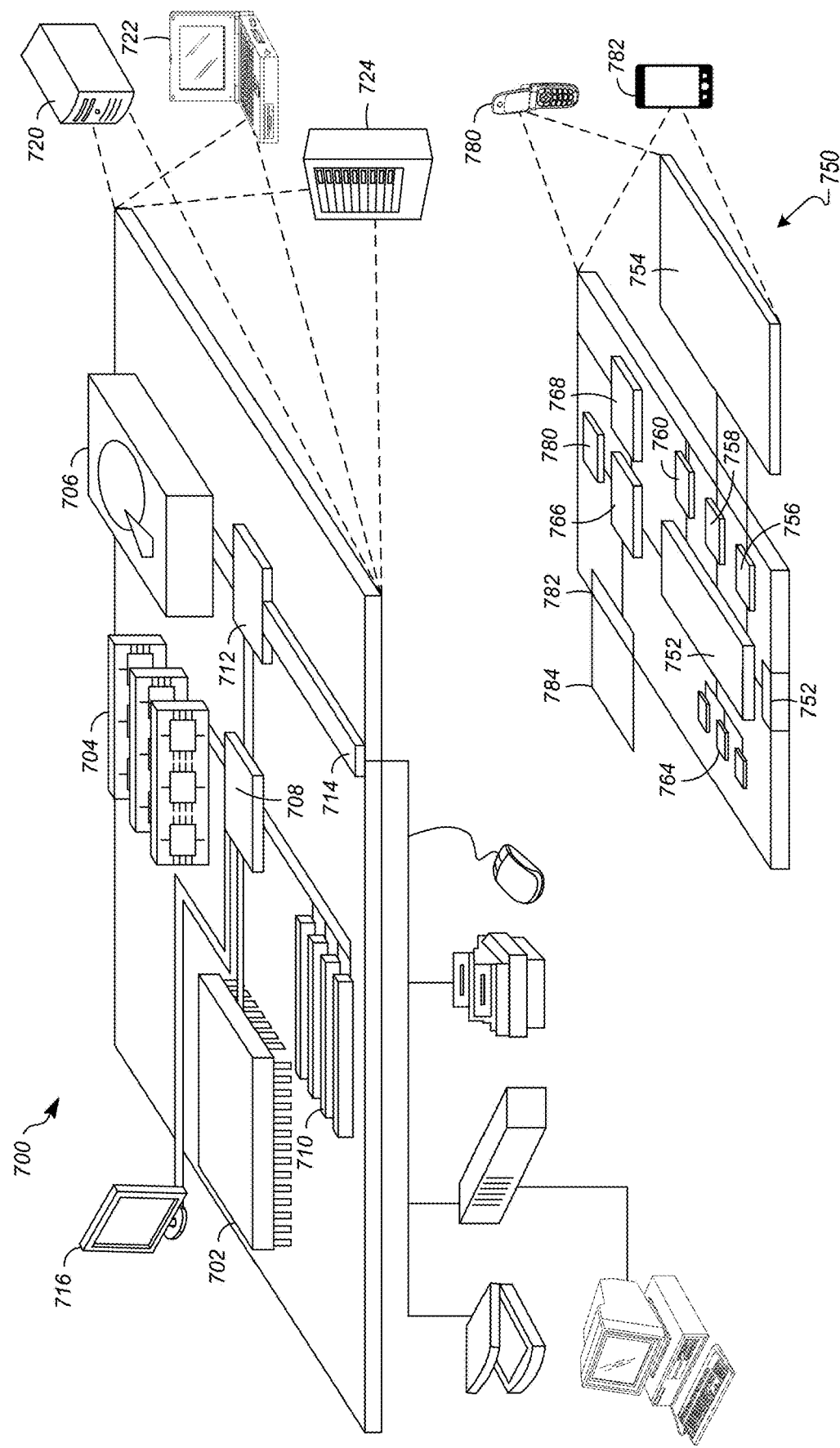
FIG. 7 illustrates an example of a computer device and a mobile computer device that can be used with the implementations described herein.

In some implementations, the computing device 200 includes at least one processor (e.g., CPU 214) configured to access memory (e.g., memory 704 in FIG. 7). The computing device 200 may also include at least one communications interface (e.g., interfaces 708 and 712 in FIG. 7). In some implementations, the computing device 200 includes an enclosure including the conductive rear surface 208 aligned parallel to the cover glass surface 202. The rear surface 208 may be coupled to the cover glass surface 202 via enclosure portions 204 or 206, for example. In some implementations, the rear surface 208 may be coupled to the cover glass surface 202 directly. The computing device 200 may also include one or more touch display panels 212 mounted on at least a portion of a first surface of PCB 218 and may be disposed between the rear surface 208 and the cover glass surface 202 of the enclosure.

Figure 3:
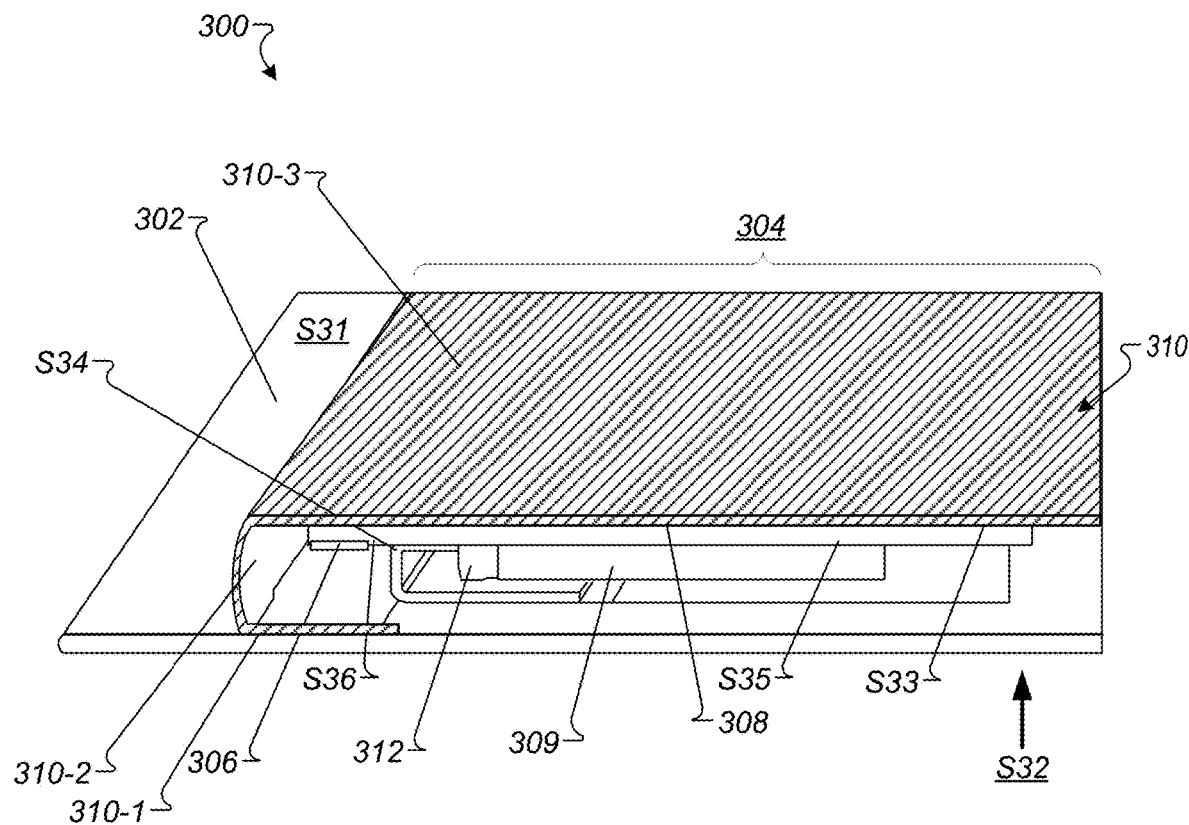
FIG. 3 illustrates a block diagram of another configuration of an example heat spreader in an example computing device.

FIG. 3 illustrates a block diagram of another configuration of a heat spreader in a computing device 300. In the depicted example, a cover glass 302 is shown under a display assembly 304. In some implementations, the display assembly 304 is for a portable computing device, such as a laptop, a tablet, a mobile device, etc. In some implementations, the display assembly 304 includes the cover glass 302 affixed to display components, heat spreader components, etc. The cover glass 302 includes a surface (S31) in which display assembly 304 emits image content through to a viewing surface (S32) of the cover glass 302 of computing device 300.

The display assembly 304 includes the cover glass 302, at least one heat generating element (e.g., battery 306), at least one structure (e.g., PCB 308), a display panel 309, and a heat spreader portions 310-1, 310-2, and 310-3. As shown, the heat spreader portion 310-1 is attached to the cover glass 302 (on surface S31) with adhesive, similar to the adhesives described throughout this disclosure. For example, the adhesive 220-1 may be integrated into heat spreader 310, which can be adhered to one or more device components including cover glass 302.

In some implementations, the PCB 308 may include any number of heat generating elements 306, PCBs 308, and/or display panels 309 mounted thereto. For example, multiple touch panel displays 309 may be provided on a single computing device 300. The heat spreader portions 310-1, 310-2, and 310-3 may form a continuous heat spreader element that includes a single sheet including at least one layer of graphite coupled to at least one layer of insulating material. The at least one layer of graphite may be configured to conduct heat generated by system components (e.g., heat generating element 306) away from such components to ensure that hot spots and device component heating are minimized.

In some implementations, heat spreader portions 310-1, 310-2, and 310-3 form a continuous heat spreader element that provides heat dissipation and/or electrical insulation for the components of assembly 304. In some implementations, heat spreader portions 310-1, 310-2, and 310-3 are separate components adhered to one or more device components to insulate and/or dissipate heat generated by one or more heat generating components (e.g., battery 306). In some implementations, the heat spreader portions 310-1, 310-2, and 310-3 are formed of a graphite heat spreading sheet laminated on one entire surface to an insulating sheet to form a graphite heat spreading sheet assembly. The combined graphite heat spreading sheet assembly may be folded over (or around or partially around) one or more of the battery 306, the PCB 308, and/or the touch display panel(s) 309. In some implementations, the combined graphite heat spreading sheet assembly may be wrapped around a rear side of the PCB 308 and continue beyond the surface of the rear side of the PCB 308 to ensure heat can be dissipated from components to a surface of a computing device enclosure (not shown). In some implementations, the heat spreader portions 310-1, 310-2, and 310-3 are in physical contact with the PCB 308 (e.g., at surface S33) and the cover glass 302 (e.g., at surface S31).

In some implementations, the display assembly 304 includes the PCB 308, at least one touch display panel 309 mounted to a first lateral surface (S35) of the PCB 308. The display assembly 304 also includes a continuous heat spreader element 310 may include a portion 310-3 aligned along the first lateral surface (S33) of the PCB 308. The continuous heat spreader element formed of portions 310-1, 310-2, and 310-3 is shown loosely folded (e.g., wrapped)

around an edge (e.g., surface S34) and in thermal contact with a second lateral surface (e.g., surface S34) of the PCB 308.

As shown in FIG. 3, the display panel 309 is connected to a wire harness 312 to carry electrical signals from the display PCB 308 to the display panel 309 to emit light from LEDs and/or OLEDs in the display panel 309 to generate each pixel (not shown) of the display panel 309. In general, the PCB 308 and the touch display panel 309 may be aligned parallel and/or substantially parallel to each other, as the display panel 309 is typically coupled to the PCB 308. Similar to structures shown in FIG. 2, additional structures may be provided between PCB 308 and cover glass 302 in FIG. 3 and may utilize heat dissipation provided by the heat spreader elements described herein. Heat spreader portions 310-1 and 310-3 may be aligned parallel and/or substantially parallel to each other. Heat spreader element 310-2 may be aligned perpendicular and/or substantially perpendicular to heat spreader elements 310-1 and 310-3. In some implementations, heat spreader element 310-2 may follow an arcuate curve around PCB 308 and touch display panel 309 to provide a continuous head spreader element. Any of the heat spreader elements and materials described herein may be utilized to form portions 310-1, 310-2, and 310-3.

In some implementations, the display assembly 304 may include the cover glass 302, the printed circuit board 308, the touch display panel 309 mounted to a first lateral surface (S35) of the printed circuit board 308, and a continuous heat spreader element 310 configured to dissipate heat generated by a heat generating element (e.g., battery 306).

In some implementations, the continuous heat spreader element 310 may include a first portion 310-1 coupled to at least a portion of the cover glass 302 across at least part of surface (S31). The heat spreader element 310 may also include a second portion 310-2 in thermal contact with the heat generating element (e.g., battery 306). The heat spreader element 310 may also include a third portion 310-3 in thermal contact with a second lateral surface (S36) of the PCB 308. In some implementations, the third portion 310-3 configured to be placed in thermal contact with a length of a conductive wall of a computing device enclosure. In some implementations, the continuous heat spreader element 310 is bent around the heat generating element (e.g., battery 306) and the PCB 308 to provide thermal contact with the heat generating element (e.g., battery 306) and electrical insulation for the PCB 308.

In some implementations, the heat generating element 306 is a battery and the continuous heat spreader element 310 is formed of at least one layer of insulating material and at least one layer of graphite. The at least one layer of graphite layer may be configured to conduct heat generated by the battery 306 away from the touch display panel 309 and away from the battery 306. The continuous heat spreader element 310 may provide heat dissipation away from the touch display panel 309 and toward the conductive wall of the computing device enclosure (e.g., rear wall 208).

In some implementations, the continuous heat spreader element 310 is a layered graphite heat spreading sheet folded over the touch display panel 309 and adhered to the PCB 308 on a first side (e.g., S33) of the continuous heat spreader element 310.

Figure 4A:
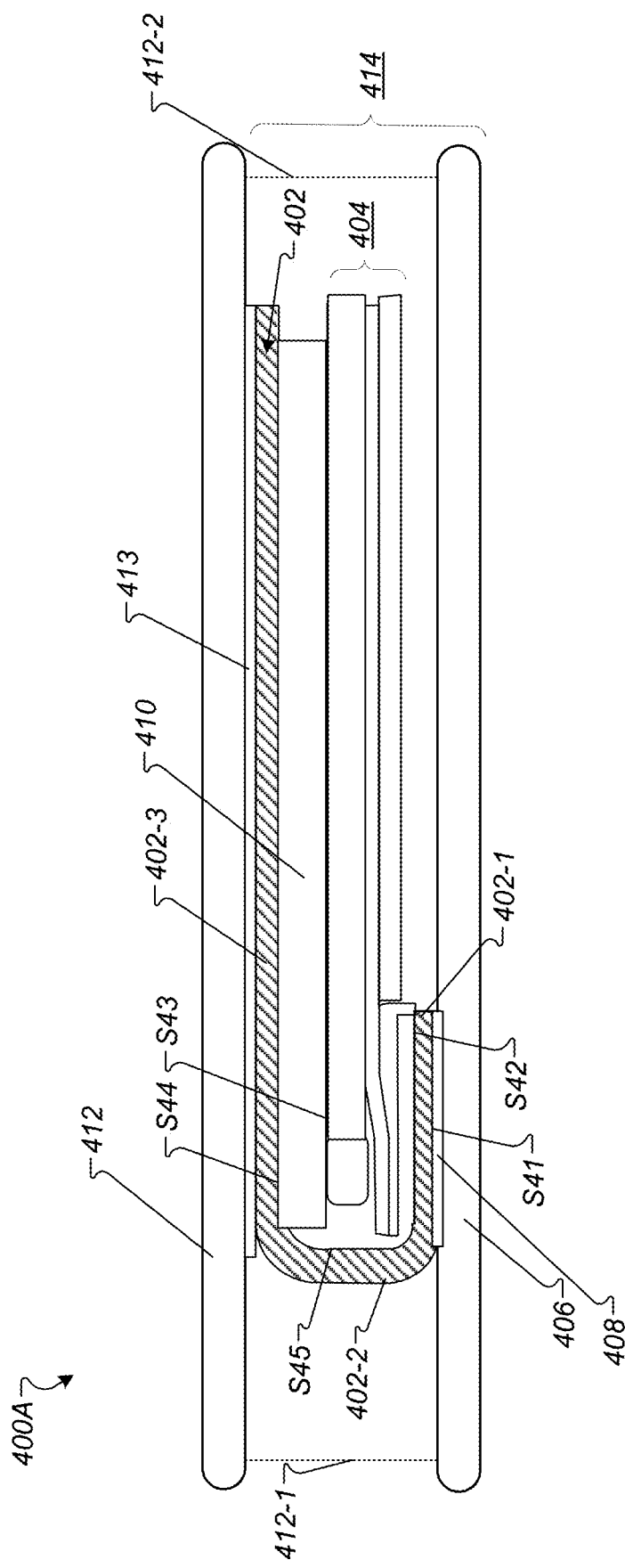
FIGS. 4A and 4B illustrate block diagrams of example configurations of an example heat spreader in an example computing device.

In some implementations, the continuous heat spreader element 310 includes at least one electrical insulation layer (e.g., 210-B) formed of polyethylene terephthalate (PET), at least one graphite heat dissipating layer (e.g., 210-C) and at least one adhesive layer (e.g., 220-1, 220-2). FIG. 4A illustrates an example computing device 400A with an example configuration of a heat spreader 402 for dissipating heat from one or more heat generating elements 404. The heat spreader 402 may include at least three portions 402-1, 402-2, and 402-3, although the portions may be one continuous sheet of heat dissipating material.

As shown, the heat generating element 404 is coupled on a first surface (S41) of the heat spreader 402. The cover glass 406 may be coupled to (or substantially in contact with or coupled to) the heat spreader 402 (at portion 402-1) with an adhesive 408, as described throughout this disclosure. In addition, at least a portion of the heat generating element 404 may be in thermal contact with and/or coupled to (or substantially in contact with or coupled to) the heat spreader 402 at a surface (S42). The heat generating element 404 may be coupled to (or substantially in contact with or coupled to) at least one additional structure 410 along a surface (S43) of the structure 410. In some implementations, the heat generating element 404 is a display panel portion and the structure 410 is a PCB. In addition, the at least one additional structure 410 (e.g., a PCB) may be coupled to (or substantially in contact with or coupled to) the heat spreader 402 (at portion 402-3) along an entire surface (S44) of the structure 410.

As shown in FIG. 4A, the heat spreader (at portion 402-3) may be in thermal contact with an enclosure 412 of the computing device 400A. The heat spreader 402 (portions 402-1, 402-2, and 402-3) may surround and/or or partially surround the at least one additional structure 410 on at least one surface and may surround at least a portion of the heat generating element 404 to form at least thermal contact with the heat spreader 402. In some implementations, the heat spreader 402 may be a flexible sheet of graphite with a laminated sheet of electrical insulating material. The graphite may conduct heat away from heat generating elements, such as element 404 while the electrical insulating material can insulate one or more additional structures (e.g., structure 410) to avoid overheating of such structures. In some implementations, the heat spreader 402 may be directed to be spread across the enclosure 412 (and/or enclosure portions 412-1 and 412-2), for example.

In some examples, the heat generating element 404 may be a display device. The display device may be included in a display assembly 414, which may be seated within computing device 400A. The display assembly 414 may include the heat spreader 402 (with portions 402-1, 402-2, and 402-3), the heat generating element 404 (e.g., a touch panel display), the structure 410 (e.g., a PCB), and the cover glass 406. In general, the touch display panel (e.g., element 404) may be mounted to the lateral surface (S43) of the PCB (e.g., structure 410).

The heat spreader 402 may be a continuous heat spreader element configured to dissipate heat generated by a heat generating element, such as display panel element 404. The continuous heat spreader 402 may include a first portion (e.g., portion 402-1) coupled to at least a portion of the cover glass 406. The continuous heat spreader 402 may include a second portion (402-2) in thermal contact with the heat generating element 404 on at least two surfaces (e.g., surface S42 and surface S45) of the heat generating element 404. The continuous heat spreader 402 may include a third portion 402-3 coupled to a second lateral surface (S44) of the PCB 410. The third portion 402-3 may be configured to be placed in thermal contact with a length of a conductive wall of a computing device enclosure (e.g., enclosure 412). For example, the heat spreader portion 402-3 may be coupled to enclosure portion 412 with an adhesive layer 413. The adhesive layer 413 may be manufactured as part of the heat spreader 402.

In some implementations, the continuous heat spreader 402 is bent around the heat generating element 404 (e.g., as shown by surface S45). The PCB 410 may be in thermal contact with the heat generating element 404. Thus, the heat spreader 402 may provide heat dissipation for the PCB, components on the PCB, and/or heat generating element 404 while also providing a layer of electrical insulation for the PCB 410 and/or other components mounted to (or coupled to) PCB 410.

In some implementations, the heat spreader 402 is formed of at least one layer of graphite configured to conduct heat generated by the touch display panel (e.g., element 404) away from the touch display panel and toward an enclosure 412, for example. This movement of heat from heat generating elements to an enclosure can provide the advantage of dissipating hot spots and spreading the heat across an entire enclosure surface such that a user handling the enclosure (e.g., of a computing device) may not discern a temperature difference between portions of the surface of the enclosure.

In some implementations, the display assembly 414 is for a portable computing device (e.g., device 400A) that utilizes the heat spreader 402 formed of at least one layer of flexible graphite laminated to a layer of insulating material. In general, the heat spreader 402 may be configured to conduct heat away from the heat generating element 404 to another structure (e.g., enclosure 412) that is thermally isolated (or substantially thermally isolated) from the heat generating element 404. The heat spreader 402 may be folded over at least one surface of the PCB 410 and wrapped at least partially around the display panel (e.g., element 404 and/or other heat generating element). In some implementations, the heat spreader 402 is a flexible sheet assembly that is in physical contact with at least a portion of the touch panel display (e.g., element 404) while also in physical contact with the PCB 410, and in physical contact with a portion of the enclosure (e.g., cover glass 406).

Figure 4B:
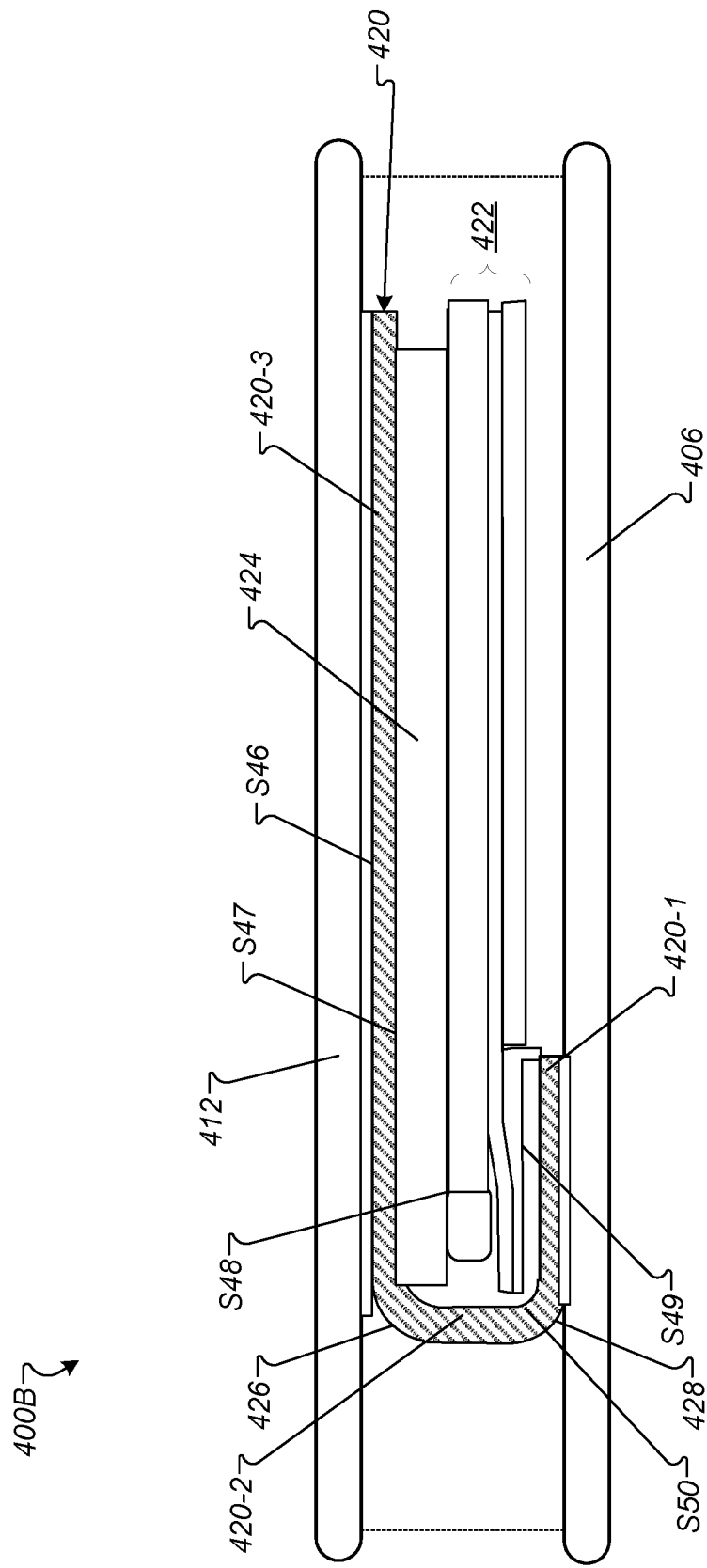

As shown in FIG. 4B, a computing device 400B includes a heat spreader 420 with portions 420-1, 420-2, and 420-3. The heat spreader 420 provides a slightly different shape and length than heat spreader 402 (in FIG. 4A). For example, the heat spreader 420 may include at least one corner 426 with a bend radius that is larger than the bend radius at a second corner 428. The heat spreader 420 may perform similar heat dissipation to pull heat off heat generating elements such as display device 422, PCB 424, and any other components (not shown) mounted on PCB 424.

The ability to modify the shape of the heat spreader 420 may allow devices to improve shielding (e.g., insulating) of components in specific areas of the device and/or provide less or more thermal dissipation in other areas of the device. In addition, the heat spreader portion 420-1 is shorter than heat spreader portion 402-1. The shorter device may save manufacturing cost while still providing heat dissipation of display device 422, for example.

As shown in FIG. 4B, a bottom enclosure 412 is in thermal contact with the heat spreader portion 420-3 at or near surface (S46). The heat spreader portion 420-3 may be coupled to (or substantially in contact with or coupled to) PCB 424 at surface (S47). The display 422 may be mounted to the lateral surface (S48) of the PCB 424. The heat spreader portion 420-2 may surround the PCB 424 and the display 422 to shield such components and/or to dissipate heat from such components. The heat spreader portion 420-2 may be in thermal and/or physical contact with PCB 424 and/or display 422.

The heat spreader portion 420-1 may be aligned in parallel along the lateral surface (S49) in thermal contact with the display 422. The heat spreader portion 420-1 may be partially wrapped around the display 422 and in thermal contact with display 422 at surface (S49).

Figure 5A:
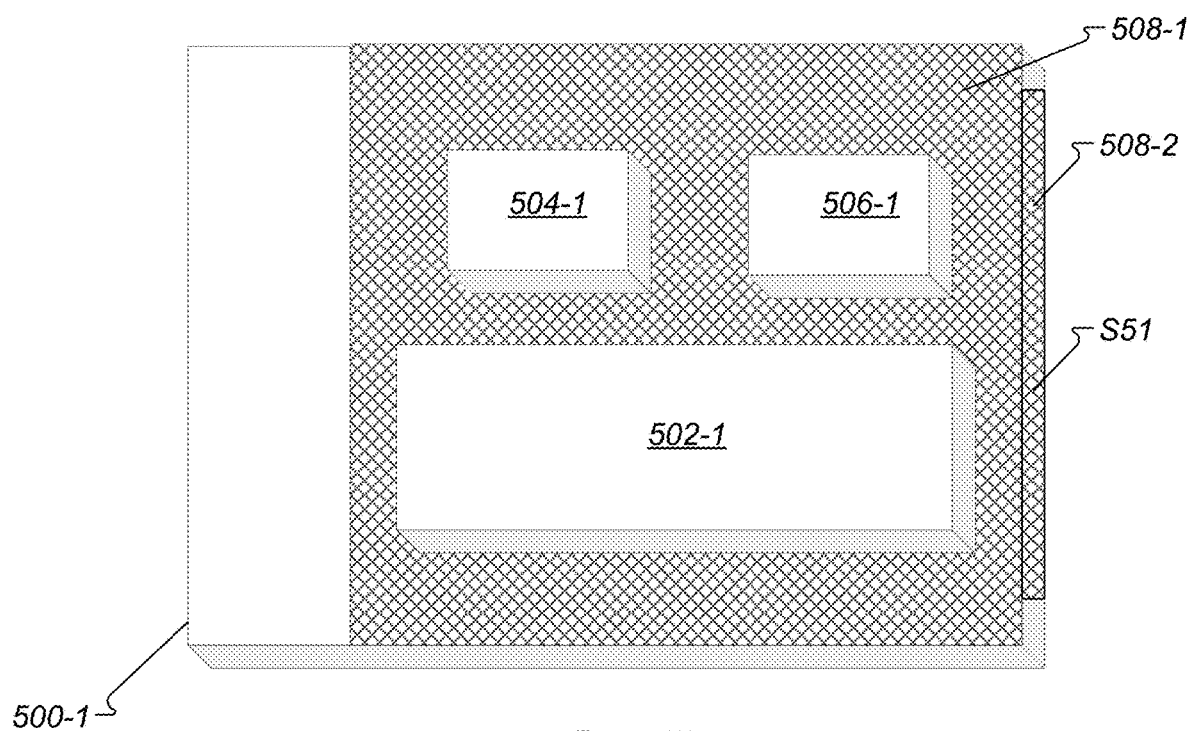
FIGS. 5A and 5B illustrate block diagrams of further configurations of an example heat spreader.
Figure 5B:
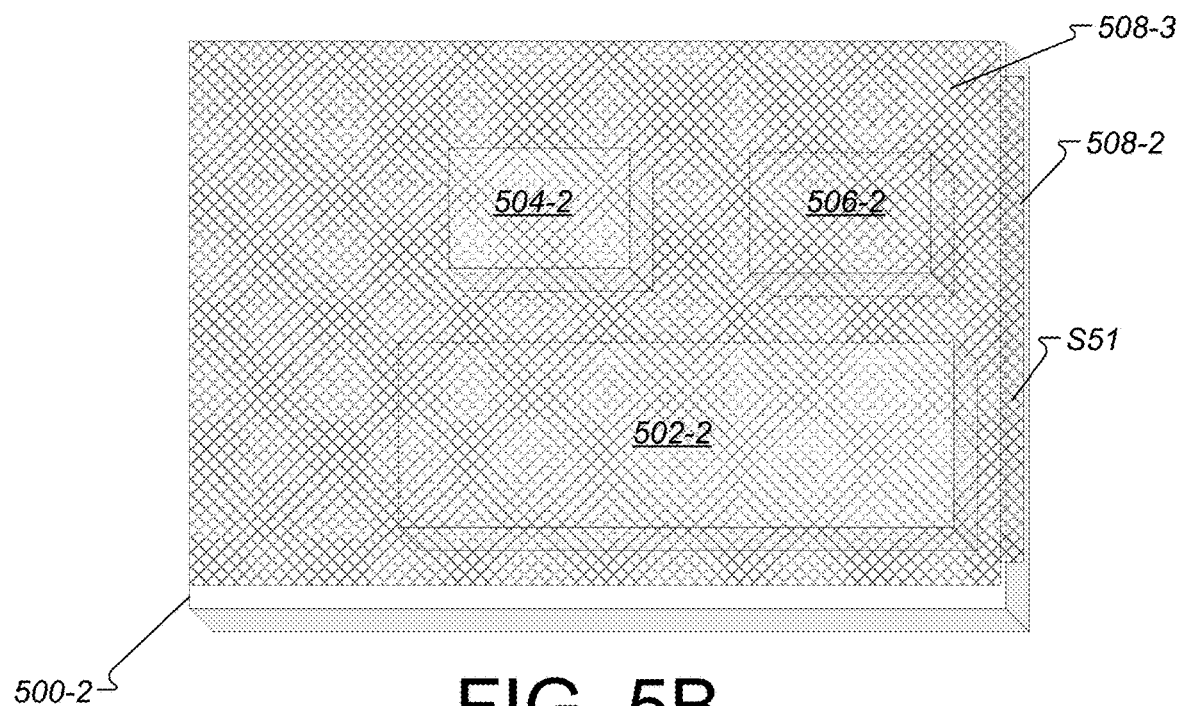

FIGS. 5A and 5B illustrate block diagrams of further configurations of a heat spreader. As shown in FIGS. 5A and 5B, a computing device may include at least one structure 500-1, 500-2, on which heat generating elements 502-1, 502-2, 504-1, 504-2, 506-1, 506-2 are coupled (or substantially in contact with). The at least one structure 500-1, 500-2 may be a circuit board, a heat sink, a trace, or a frame, and the like of a computing device. The heat generating elements 502-1, 502-2, 504-1, 504-2, 506-1, 506-2 may generate one or more hot spots on the at least one structure 500-1, 500-2. A heat spreader having at least three portions 508-1, 508-2, 508-3 may be wrapped around one or more structures in such a computing device. In some implementations, the at least one structure 500-1 and 500-2 represent a PCB element in a computing device.

As shown in FIG. 5A, heat spreader portions 508-1, 508-2 represent a portion of a flexible sheet for conducting heat away from hot spots caused by heat generating elements 502-1, 504-1, and 506-1 while electrically insulating such components from electrical shorting. The heat spreader portions 508-1 and 508-2 may conduct heat away from such hot spots in one (or substantially one) direction or along one (or substantially one) path to another structure (e.g., an enclosure of the computing device) that is thermally isolated (or substantially thermally isolated) from the at least one structure 500-1.

The heat spreader 508-1 is physically coupled to at least one surface of the at least one structure 500-1 and may be at least in thermal contact with at least one portion of heat generating elements 502-1, 504-1, and 506-1. The heat spreader 508-1 is depicted shorter than the length of the structure 500-1. The heat spreader 508-2 represents a wrapped edge of the heat spreader. Heat spreader 508-2 is shown placed in at least thermal contact with at least one edge of heat generating elements 502-1 and 506-1.

As shown in FIG. 5B, a heat spreader portion 508-3 represents a portion of the flexible sheet conducting heat away from the heat generating elements 502-2, 504-2, and 506-2 in one (or substantially one) direction or along one (or substantially one) path to another structure (e.g., an enclosure of the computing device) that is thermally isolated (or substantially thermally isolated) from the at least one structure 500-2. Here, the heat generating elements 502-2, 504-2, and 506-2 are shown transparent to represent a location of heat generating elements 502-1, 504-1, and 506-1 underneath the heat spreader portion 508-3. That is, from FIG. 5A to FIG. 5B, the heat spreader is shown wrapping components 502-2, 504-2, and 506-2 and the structure 500-1, 500-2 around a side surface (S51). Other elements, components, or structures may be placed between components 502-2, 504-2, and 506-2 and heat spreader portion 508-3.

The heat spreader sheet represented by portions 508-1, 508-2, and 508-3 may be formed of a flexible sheet of heat spreader material and electrically insulating material cut in a particular shape. Alternatively, or in addition to, the heat spreader sheet represented by portions 508-1, 508-2, and 508-3 may be formed of many pieces of heat spreader material assembled together with a thermally conductive adhesive layer. In some implementations, at least one layer of the heat spreader sheet represented by portions 508-1, 508-2, and 508-3 may be constructed of a same or a different material. For example, portion 508-1 may be copper while portions 508-2 and 508-3 may be graphite.

In operation of the computing device housing structure 500-1, 500-2, the heat spreader portions 508-1, 508-2, and 508-3 are configured to conduct heat away from the heat generating elements 502, 504, and 506 (represented by 502-1, 502-2, 504-1, 504-2, 506-1, 506-2) in more than one direction or path. For example, heat spreader elements 508-1, 508-2, and 508-3 may conduct heat toward the back of the computing device to an isolated (or substantially thermally isolated) back structure (not shown).

In general, adhesive may be used between heat generating elements 502-1, 502-2, 504-1, 504-2, 506-1, 506-2 and structure 500-1, 500-2 and/or between heat generating elements 502-1, 502-2, 504-1, 504-2, 506-1, 506-2 and heat spreader elements 508-1, 508-2, and/or 508-3.

Figure 6A:
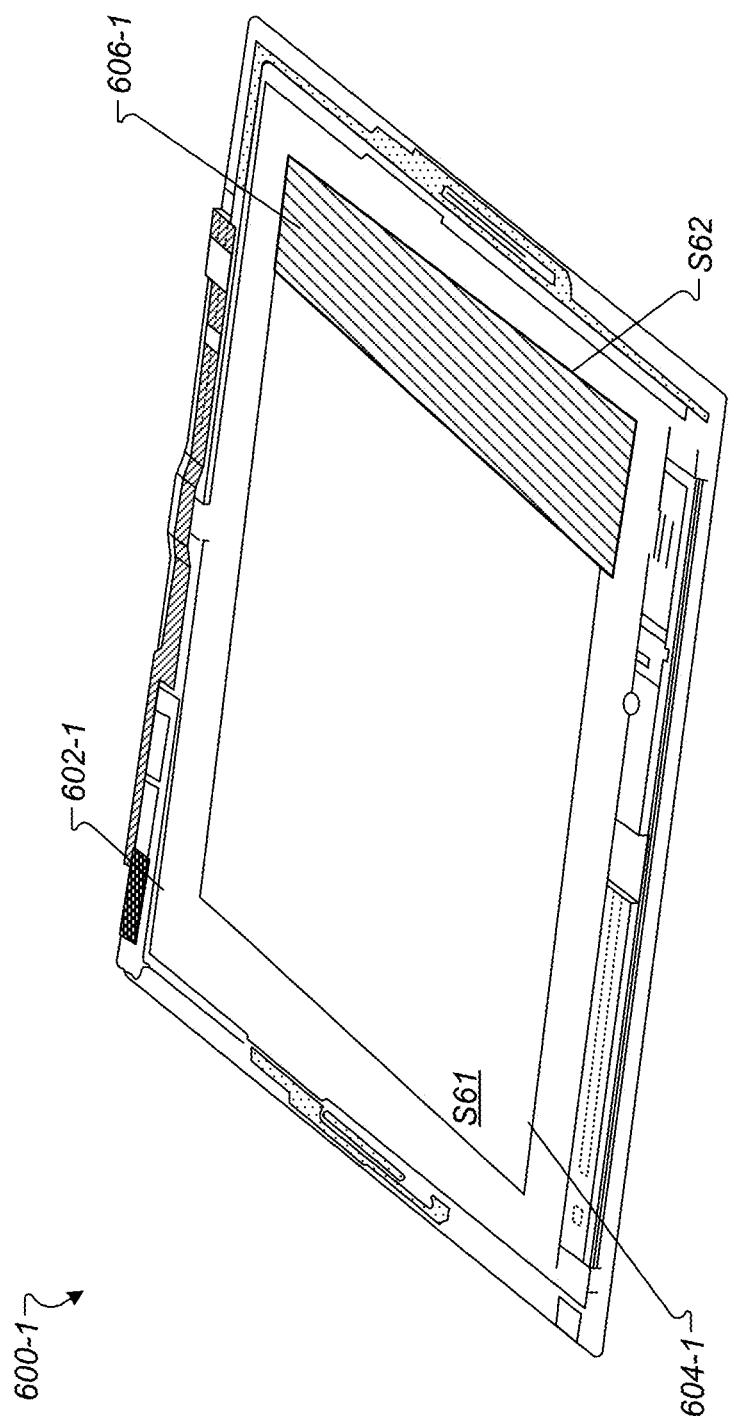
FIGS. 6A and 6B illustrate a perspective view of an example computing device display assembly with an example integrated heat spreader and printed circuit board (PCB) insulator.
Figure 6B:
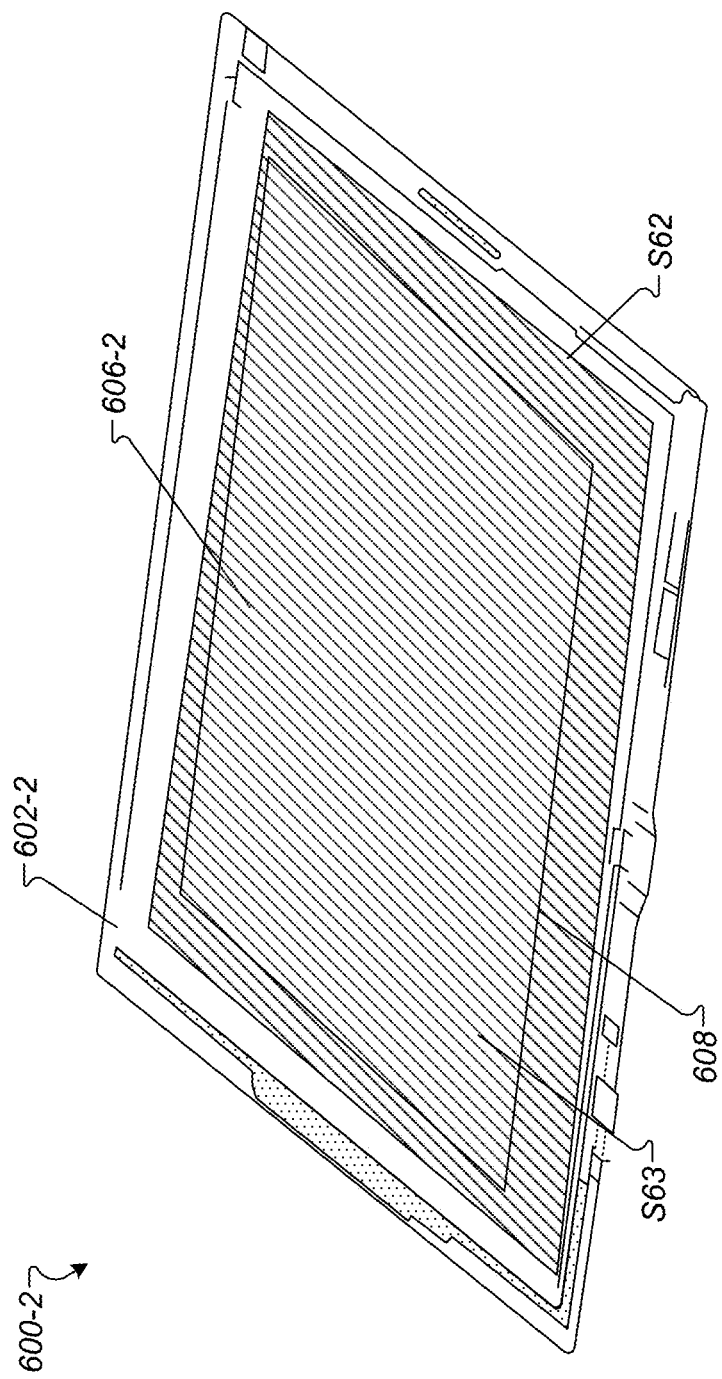

FIGS. 6A and 6B illustrate a perspective view of an example computing device display assembly 600-1, 600-2 with an integrated heat spreader and PCB insulator. FIG. 6A depicts a portion of a top perspective view of the computing device housing display assembly 600-1, 600-2. FIG. 6B depicts a portion of a bottom perspective view of the computing device housing display assembly 600-1, 600-2. In general, the computing device may include any number of processors, communications interfaces, and components. The computing device may include an enclosure, as described above. As shown, a portion of the enclosure is depicted as cover glass 602-1, 602-2. Although not depicted in FIGS. 6A-6B, the enclosure may also include a conductive rear surface aligned parallel to the surface of cover glass 602-1, 602-2. Such a surface may be used to receive heat from a flexible heat spreader 606-1, 606-2.

As shown in FIG. 6A, a touch display panel 604-1 may be mounted on a first surface of a PCB (not shown). The touch display panel 604-1 may be disposed between the rear surface of the enclosure (not shown) and the cover glass 602-1 of the display assembly 600-1, 600-2. The flexible heat spreader 606-1 may be an assembly of multiple layers of material, as described throughout this disclosure. The flexible heat spreader 606-1 is shown in thermal contact with the touch panel display 604-1 on at least a portion of a first surface (S61) of the touch panel display 604-1. The flexible sheet heat spreader 606-1 is also in thermal contact with the touch panel display 604-1 when folded around an edge of the display 604-1 (surface S62).

As shown from FIG. 6A to FIG. 6B, the flexible heat spreader 606-1 is folded around the edge (surface 62) of the display 604-1 and in thermal contact with a second surface (S63) of the PCB 608 shown (in FIG. 6B) transparently through flexible heat spreader 606-2 and in thermal contact with the rear surface of the enclosure (not shown). In this example, the flexible heat spreader 606-2 surrounds/covers the PCB 608 on at least one surface (S63). In some implementations, the flexible heat spreader 606-1, 606-2 is a continuous sheet that is placed in physical contact with the touch panel display 604-1, 604-2, the PCB 608, and the cover glass 602-1, 602-2. In some implementations, the flexible heat spreader 606-1, 606-2 includes a woven sheet of graphite strands. In some implementations, the flexible heat spreader 606-1, 606-2 includes a flexible, sheet of copper.

In some implementations, the heat generating element may be the touch display panel 604-1. One or more components enclosed within display assembly 600-1, 600-2 may generate one or more hot spots (e.g., from use of powering LEDS/OLEDs, battery usage, and/or processor usage etc.) on the PCB 608. The heat spreader 606-1, 606-2 may be configured to conduct heat generated by such components away from the PCB 608 and to the enclosure (e.g., rear panel of the computing device). In some implementations, the heat spreader 606-1, 606-2 may be configured to conduct heat generated by the components away from the PCB 608 and to a heat sink or other component in the assembly 600-1, 600-2 or the device enclosure.

Redirecting the heat can thus reduce hot spots on the cover glass 602-2 and on the bottom enclosure of the computing device. The heat spreader 606-1, 606-2 can be used to spread the heat across one or more surfaces of the computing device to ensure that hot spots are reduced or eliminated. In some implementations, the heat spreader 606-1, 606-2 (or other structures capable of dissipating heat) may be configured to dissipate the heat in at least one of the air gaps within the device enclosure, for example.

In some implementations, the computing devices described herein may be a tablet type computing device, or the like. In some implementations, the computing devices described herein may be a laptop type computing device, or the like. In some implementations, the computing devices described herein may be a mobile phone type computing device, or the like. Other electronic devices are also possible.

FIG. 7 illustrates an example of a generic computer device 700 and a generic mobile computer device 750, which may be used with the techniques described here. As shown in FIG. 7, computing device 700 is intended to represent various forms of digital computers, such as laptops, desktops, workstations, personal digital assistants, servers, blade servers, mainframes, and other appropriate computers. Computing device 750 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 700 includes a processor 702, memory 704, a storage device 706, a high-speed interface 708 connecting to memory 704 and high-speed expansion ports 710, and a low speed interface 712 connecting to low speed bus 714 and storage device 706. Each of the components 702, 704, 706, 708, 710, and 712, are interconnected using various busses, and may be mounted on a common motherboard or in other manners as appropriate. The processor 702 can process instructions for execution within the computing device 700, including instructions stored in the memory 704 or on the storage device 706 to display graphical information for a GUI on an external input/output device, such as display 716 coupled to high speed interface 708. In other implementations, multiple processors and/or multiple buses may be used, as appropriate, along with multiple memories and types of memory. Also, multiple computing devices 700 may be connected, with each device providing portions of the necessary operations (e.g., as a server bank, a group of blade servers, or a multi-processor system).

The memory 704 stores information within the computing device 700. In one implementation, the memory 704 is a volatile memory unit or units. In another implementation, the memory 704 is a non-volatile memory unit or units. The memory 704 may also be another form of computer-readable medium, such as a magnetic or optical disk.

The storage device 706 is capable of providing mass storage for the computing device 700. In one implementation, the storage device 706 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 704, the storage device 706, or memory on processor 702.

The high speed controller 708 manages bandwidth-intensive operations for the computing device 700, while the low speed controller 712 manages lower bandwidth-intensive operations. Such allocation of functions is exemplary only. In one implementation, the high-speed controller 708 is coupled to memory 704, display 716 (e.g., through a graphics processor or accelerator), and to high-speed expansion ports 710, which may accept various expansion cards (not shown). In the implementation, low-speed controller 712 is coupled to storage device 706 and low-speed expansion port 714. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 720, or multiple times in a group of such servers. It may also be implemented as part of a rack server system 724. In addition, it may be implemented in a personal computer such as a laptop computer 722. Alternatively, components from computing device 700 may be combined with other components in a mobile device (not shown), such as device 750. Each of such devices may contain one or more of computing device 700, 750, and an entire system may be made up of multiple computing devices 700, 750 communicating with each other.

Computing device 750 includes a processor 752, memory 764, an input/output device such as a display 754, a communication interface 766, and a transceiver 768, among other components. The device 750 may also be provided with a storage device, such as a microdrive or other device, to provide additional storage. Each of the components 750, 752, 764, 754, 766, and 768, are interconnected using various buses, and several of the components may be mounted on a common motherboard or in other manners as appropriate.

The processor 752 can execute instructions within the computing device 750, including instructions stored in the memory 764. The processor may be implemented as a chipset of chips that include separate and multiple analog and digital processors. The processor may provide, for example, for coordination of the other components of the device 750, such as control of user interfaces, applications run by device 750, and wireless communication by device 750.

Processor 752 may communicate with a user through control interface 758 and display interface 756 coupled to a display 754. The display 754 may be, for example, a TFT LCD (Thin-Film-Transistor Liquid Crystal Display) or an OLED (Organic Light Emitting Diode) display, or other appropriate display technology. The display interface 756 may comprise appropriate circuitry for driving the display 754 to present graphical and other information to a user. The control interface 758 may receive commands from a user and convert them for submission to the processor 752. In addition, an external interface 762 may be provided in communication with processor 752, so as to enable near area communication of device 750 with other devices. External interface 762 may provide, for example, for wired communication in some implementations, or for wireless communication in other implementations, and multiple interfaces may also be used.

The memory 764 stores information within the computing device 750. The memory 764 can be implemented as one or more of a computer-readable medium or media, a volatile memory unit or units, or a non-volatile memory unit or units. Expansion memory 774 may also be provided and connected to device 750 through expansion interface 772, which may include, for example, a SIMM (Single In Line Memory Module) card interface. Such expansion memory 774 may provide extra storage space for device 750, or may also store applications or other information for device 750. Specifically, expansion memory 774 may include instructions to carry out or supplement the processes described above, and may include secure information also. Thus, for example, expansion memory 774 may be provided as a security module for device 750, and may be programmed with instructions that permit secure use of device 750. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 764, expansion memory 774, or memory on processor 752, that may be received, for example, over transceiver 768 or external interface 762.

Device 750 may communicate wirelessly through communication interface 766, which may include digital signal processing circuitry where necessary. Communication interface 766 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 768. In addition, short-range communication may occur, such as using a Bluetooth, WiFi, or other such transceiver (not shown). In addition, GPS (Global Positioning System) receiver module 770 may provide additional navigation- and location-related wireless data to device 750, which may be used as appropriate by applications running on device 750.

Device 750 may also communicate audibly using audio codec 760, which may receive spoken information from a user and convert it to usable digital information. Audio codec 760 may likewise generate audible sound for a user, such as through a speaker, e.g., in a handset of device 750. Such sound may include sound from voice telephone calls, may include recorded sound (e.g., voice messages, music files, etc.) and may also include sound generated by applications operating on device 750.

The computing device 750 may be implemented in a number of different forms, as shown in the figure. For example, it may be implemented as a cellular telephone 780.

It may also be implemented as part of a smart phone 782, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

Specific structural and functional details disclosed herein are merely representative for purposes of describing example embodiments. Example embodiments, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including,"

when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Lastly, it should also be noted that whilst the accompanying claims set out particular combinations of features described herein, the scope of the present disclosure is not limited to the particular combinations hereafter claimed, but instead extends to encompass any combination of features or embodiments herein disclosed irrespective of whether or not that particular combination has been specifically enumerated in the accompanying claims at this time.

What is claimed is:

1. An apparatus, comprising:
an enclosure including a first sidewall, a second sidewall aligned parallel to the first sidewall, a display cover glass, a rear wall aligned parallel to the display cover glass, at least one structure disposed between the display cover glass and the rear wall;
a heat generating element within the enclosure, the heat generating element being mounted to a first surface of the at least one structure; and
a flexible sheet assembly configured to dissipate heat generated by the heat generating element away from the heat generating element and across a lateral surface of the rear wall of the enclosure, the flexible sheet assembly including:
a first portion proximate and coupled to at least a portion of the display cover glass of the enclosure,
a second portion bent around and configured to dissipate the heat away from at least two surfaces of the heat generating element, and
a third portion coupled to a second surface of the at least one structure, the third portion being in contact with a length of the rear wall of the enclosure.

2. The apparatus of claim 1, wherein:
the at least one structure includes a printed circuit board, the heat generating element includes a CPU, and
the flexible sheet assembly configured to dissipate the heat away from both the printed circuit board and the CPU.

3. The apparatus of claim 1, wherein the flexible sheet assembly includes multiple layers including at least an electrically insulating layer, a heat dissipating layer, and an adhesive layer.

4. The apparatus of claim 1, wherein:
the at least one structure is a printed circuit board housing at least a display panel, a CPU, and a battery, and
the flexible sheet assembly includes a graphite layer and an electrically insulating layer configured to provide spreading of the heat and electrical insulation for the display panel, the CPU, and the battery.

5. The apparatus of claim 4, wherein:
the display panel is a touch screen display for a portable computing device, and
the electrically insulating layer is integrated with the graphite layer of the flexible sheet assembly.

6. The apparatus of claim 1, wherein the rear wall, the first sidewall, and the second sidewall provide a conductive enclosure assembly coupled to the display cover glass, the conductive enclosure assembly configured to dissipate the heat from the flexible sheet assembly across the lateral surface of the rear wall.

7. The apparatus of claim 6, wherein the display cover glass, the heat generating element, the at least one structure, and the flexible sheet assembly are combined with a display panel to form a display panel assembly for a portable computing device.

8. The apparatus of claim 1, wherein:
the flexible sheet assembly is attached to a first surface of the display cover glass with adhesive,
the flexible sheet assembly is attached to the second surface of the at least one structure with the adhesive, and
wherein the flexible sheet assembly is bent around the heat generating element and the at least one structure to provide thermal dissipation for at least two surfaces of the at least one structure and the at least two surfaces of the heat generating element.

9. The apparatus of claim 8, wherein the adhesive includes a thermal conductor.

10. The apparatus of claim 1, wherein the flexible sheet assembly is in physical contact with the at least one structure and the display cover glass.

11. The apparatus of claim 1, wherein the at least one structure includes a printed circuit board and the heat generating element includes a CPU communicably coupled to multiple display panels mounted to the printed circuit board.

12. A display assembly, comprising:
a cover glass;
a printed circuit board;
a touch display panel mounted to a first lateral surface of the printed circuit board; and
a continuous heat spreader element configured to dissipate heat generated by a heat generating element, the continuous heat spreader element including:
a first portion coupled to at least a portion of the cover glass,
a second portion bent around and configured to dissipate the heat away from at least two surfaces of the heat generating element, and
a third portion coupled to a second lateral surface of the printed circuit board, the second lateral surface opposite to the first lateral surface, the third portion being configured to be placed in contact with a length of a conductive wall of a computing device enclosure,
wherein the continuous heat spreader element is bent around the heat generating element and the printed circuit board to provide thermal dissipation for the heat generating element and electrical insulation for the printed circuit board.

13. The display assembly of claim 12, wherein the heat generating element is a battery and the continuous heat spreader element is formed of at least one layer of insulating material and at least one layer of graphite configured to conduct the heat generated by the battery away from the touch display panel and away from the battery, the continuous heat spreader element being coupled to a cover glass and configured to dissipate the heat away from the battery.

14. The display assembly of claim 12, wherein the continuous heat spreader element is formed of graphite that provides dissipation of the heat away from the touch display panel and to the conductive wall of the computing device enclosure.

15. The display assembly of claim 12, wherein the continuous heat spreader element is a layered graphite heat spreading sheet folded over the touch display panel and adhered to the printed circuit board on a first side of the continuous heat spreader element.

16. The display assembly of claim 12, wherein:
the display assembly is for a portable computing device, and
the continuous heat spreader element includes at least one electrical insulation layer formed of polyethylene terephthalate (PET), at least one graphite heat dissipating layer, and at least one adhesive layer.

17. A computing device comprising:
at least one processor configured to access memory;
at least one communications interface;
an enclosure including a conductive rear surface aligned parallel to a cover glass surface, the rear surface being coupled to the cover glass surface;
a touch display panel mounted on a first surface of a printed circuit board and disposed between the rear surface and the cover glass surface of the enclosure; and
a flexible sheet assembly configured to conduct heat generated by the at least one processor away from the at least one processor and across a lateral surface of the rear surface, the flexible sheet assembly including,
a first portion coupled to at least a portion of the cover glass surface,
a second portion bent around and configured to dissipate the heat away from the at least one processor, and
a third portion coupled to a second surface of the printed circuit board, the second surface opposite to the first surface, the third portion being in contact with a length of the lateral surface of the conductive rear surface.

18. The computing device of claim 17, wherein the flexible sheet assembly is in physical contact with at least a portion of the touch display panel, the printed circuit board, and the cover glass surface.

19. The computing device of claim 17, wherein the flexible sheet assembly includes a woven sheet of graphite strands.

20. The computing device of claim 17, wherein the flexible sheet assembly includes a sheet of copper.

* * * * *